(12) United States Patent
Sugeno

(10) Patent No.: US 7,470,554 B2
(45) Date of Patent: Dec. 30, 2008

(54) FORMING METHOD OF STACKING STRUCTURE AND MANUFACTURING METHOD OF ELECTRON SOURCE AND IMAGE DISPLAY APPARATUS USING SUCH METHOD

(75) Inventor: Toru Sugeno, Kanagawa-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 368 days.

(21) Appl. No.: 11/212,639

(22) Filed: Aug. 29, 2005

(65) Prior Publication Data

US 2006/0046474 A1    Mar. 2, 2006

(30) Foreign Application Priority Data

Aug. 31, 2004   (JP)   ............... 2004-251412

(51) Int. Cl.
*H01L 21/469*   (2006.01)
*H01C 7/00*   (2006.01)
*B05D 3/02*   (2006.01)
*H01L 29/06*   (2006.01)

(52) U.S. Cl. .................. 438/20; 438/781; 427/98.9; 427/117

(58) Field of Classification Search .......... 148/DIG. 47, 148/DIG. 124, DIG. 137; 257/10; 427/77–78, 427/96.1, 97.1–97.3, 97.6, 98.9, 101–103, 427/117–120; 430/330; 438/20, 34, 780–781
See application file for complete search history.

(56) References Cited

U.S. PATENT DOCUMENTS

| | | | | |
|---|---|---|---|---|
| 6,604,970 B1 * | 8/2003 | Yamada | ........................ | 445/24 |
| 6,614,167 B1 | 9/2003 | Ono et al. | .................... | 313/495 |
| 6,653,232 B2 * | 11/2003 | Uda et al. | .................... | 438/669 |
| 6,794,813 B2 | 9/2004 | Ono et al. | .................... | 313/495 |

FOREIGN PATENT DOCUMENTS

JP    2003-133689    5/2003

* cited by examiner

*Primary Examiner*—Douglas M Menz
*Assistant Examiner*—Matthew W Such
(74) *Attorney, Agent, or Firm*—Fitzpatrick, Cella, Harper & Scinto

(57) ABSTRACT

A method of forming a stacking structure by forming an electroconductive layer precursor pattern by an electroconductive paste made of a resin component, electroconductive fine particles, and glass fine particles, forming a dielectric layer precursor pattern by a dielectric paste made of a resin component and glass fine particles, and simultaneously baking both of those patterns, wherein they are held for a predetermined time while keeping a baking temperature which is equal to or higher than a decomposing temperature of the resin component and is equal to or lower than a baking start temperature of the glass fine particles and, thereafter, their baking is completed at the baking temperature which is equal to or higher than the baking start temperature of the glass fine particles and is lower than its softening point. Thus, the occurrence of a void and a pin hole in an insulative layer can be prevented in the stacking structure after the baking.

5 Claims, 9 Drawing Sheets

FORMING METHOD OF STACKING STRUCTURE AND MANUFACTURING METHOD OF ELECTRON SOURCE AND IMAGE DISPLAY APPARATUS USING SUCH METHOD

This application claims priority from Japanese Patent Application No. 2004-251412 filed on Aug. 31, 2004, which is hereby incorporated by reference herein.

BACKGROUND OF THE INVENTION

1. Field of the Invention

The invention relates to a forming method of a stacking structure comprising lower wirings and an insulative layer of an electron source having matrix wirings in which upper and lower wirings cross each other through the insulative layer and, more particularly, to a manufacturing method of the electron source and an image display apparatus to which such a forming method is applied.

2. Related Background Art

In a flat image display apparatus using electron-emitting devices, it is necessary that wirings for supplying currents to the electron-emitting devices are formed at high precision because of the realization of finer patterning. It is also required to reduce a resistance of the wirings because of the realization of a large display screen. Therefore, a method of forming wirings having a larger film thickness onto a substrate more finely and at high precision is required.

A method of using a photosensitive paste can be mentioned as a method of forming such wirings having the large-film thickness at the high precision. According to such a method, the photosensitive paste comprising a photosensitive resin component, electroconductive fine particles, glass fine particles, and the like is formed as a film onto the substrate, exposed and developed, and an electroconductive layer precursor having a desired pattern is formed, thereafter, by baking the precursor, the resin component is decomposed and removed and an electroconductive layer is formed. Such a method can be also applied to the case of forming an insulative layer by removing the electroconductive fine particles from the photosensitive paste and executing manufacturing steps similar to those mentioned above.

However, in the case where the wirings having the large film thickness are formed by using the photosensitive paste, an edge curl is caused in an edge portion of the wiring pattern due to a shortage of an exposure amount upon exposing or a volume contraction upon baking. Such a state is shown in FIGS. 9A to 9D. In the diagrams, reference numeral 91 denotes a substrate; 92 a photosensitive paste; 93 a mask; 94 an exposing unit; and 95 a wiring pattern after the baking. As shown in FIGS. 9A to 9D, a thick film of the negative type photosensitive paste 92 is formed on the whole surface of the insulative substrate 91 (FIG. 9A), exposed through the mask 93 (FIG. 9B), and developed and the exposing unit 94 is left (FIG. 9C), the exposing unit 94 is baked, and the wiring pattern 95 (FIG. 9D) is obtained.

As shown in FIG. 9D, when the insulative layer is stacked so as to partially cover the wiring pattern 95 having the edge curl, the curl portion extending upward is pressed downward by an insulative layer forming material. In this instance, an air bubble is rolled into the substrate 91 side, so that a gap is formed in the insulative layer. In the insulative layer containing such a gap, insulation performance between the upper and lower wirings deteriorates and there is a fear that a short-circuiting is caused in accordance with circumstances. In the case of using those wirings as leading wirings from a display panel having airtight performance to the outside, the airtight performance of the display panel deteriorates.

As a method of solving such a problem of the edge curl, in JP-A-2003-133689, there has been disclosed a method whereby a film of a photosensitive paste is formed as a wiring pattern and patterned, thereafter, a film of a photosensitive paste serving as an insulative layer is formed and patterned before baking, and the wiring pattern and the insulative layer pattern are simultaneously baked.

According to the method disclosed in JP-A-2003-133689, since the wiring pattern and the insulative layer pattern are simultaneously baked, there is such an advantage that the occurrence of the edge curl of the wirings can be prevented and the number of baking steps can be reduced. Even by such a method, however, since there is a case where a void or a pin hole occurs in the insulative layer, further improvement is demanded in terms of a point that the insulation performance between the upper and lower wirings and the airtight performance are maintained.

SUMMARY OF THE INVENTION

It is an object of the invention to prevent the occurrence of a void and a pin hole in an insulative layer in a method of forming a stacking structure by simultaneously baking an electroconductive layer and a dielectric layer which are stacked in at least a part by using a paste. Another object of the invention is to provide a manufacturing, method of an electron source and an image display apparatus having high reliability in which the above forming method is applied to a step of forming wirings having a large film thickness.

DETAILED DESCRIPTION OF THE PREFERRED EMBODIMENTS

Figure 1:
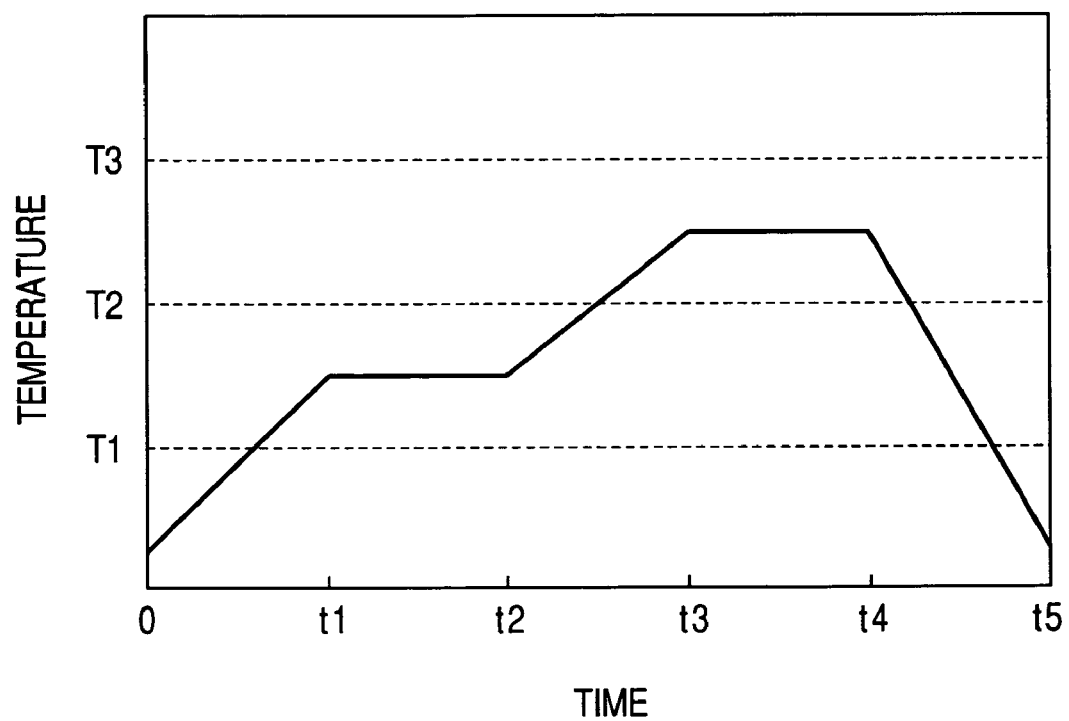
FIG. 1 shows a temperature profile of a baking step according to the invention.

According to the first invention of the present invention, there is provided a forming method of a stacking structure in which an electroconductive layer and a dielectric layer are stacked in at least a part, comprising: forming an electroconductive layer precursor pattern onto a substrate by using an electroconductive paste made of at least a resin component, electroconductive fine particles, and glass fine particles; forming a dielectric layer precursor pattern which covers at least a part of the electroconductive layer precursor pattern by using a dielectric paste made of at least the resin component and the glass fine particles; and simultaneously baking the electroconductive layer precursor pattern and the dielectric layer precursor pattern, wherein in the baking step, the patterns are held for a predetermined time while keeping a sintering temperature in a temperature range where it is equal to or higher than a decomposing temperature of the resin component and is lower than a sintering start temperature of the glass fine particles of the dielectric paste and, thereafter, they are baked at the baking temperature in a temperature range where it is equal to or higher than the baking start temperature of the glass fine particles and is lower than its softening point.

According to the second invention of the invention, there is provided a manufacturing method of the electron source having a plurality of electron-emitting devices and a plurality of lower wirings and upper wirings which cross each other through an insulative layer and connect the electron-emitting devices in a matrix form on the substrate, wherein the lower wirings and the insulative layer are formed by the forming method of the stacking structure of the invention mentioned above.

According to the third invention of the invention, there is provided a manufacturing method of an image display apparatus comprising: the electron source having the plurality of electron-emitting devices and the plurality of lower wirings and upper wirings which cross each other through the insulative layer and connect the electron-emitting devices in a matrix form on the substrate; and an image forming member having light-emitting members each for emitting light by irradiation of the electron emitted from the electron-emitting device, wherein the electron source is manufactured by the second manufacturing method of the electron source of the invention.

According to the forming method of the stacking structure of the invention, since the electroconductive layer and the dielectric layer are simultaneously baked without causing a void or a pin hole in the insulative layer, one of the baking steps is omitted, an energy which is required for the steps is reduced, and a burden on the substrate is lightened. Particularly, in the case of using silver for the electroconductive layer, such a problem that silver is diffused onto the substrate by the baking step occurs. However, according to the invention, since the number of baking steps is reduced than the conventional one, the diffusing function of silver to the substrate decreases. Further, even if the photosensitive paste is used to form the electroconductive layer, the occurrence of the edge curl is prevented. Therefore, the occurrence of the short-circuiting between the upper and lower wirings is prevented when the method of the invention is applied to the creation of the matrix wirings.

Therefore, in the manufacturing method of the electron source and the image display apparatus using the forming method of the stacking structure of the invention, the image display apparatus in which the fine matrix wirings are formed at high precision with a high yield and the reliability is high are provided at reasonable prices.

The stacking structure formed by the invention comprises: an electroconductive layer of a predetermined pattern on an insulative substrate; and a dielectric layer of a predetermined pattern which covers at least a part of the electroconductive layer. Particularly, the forming method of the invention is preferably used in the case of the electroconductive layer having a large film thickness over 5 μm. Specifically speaking, it is preferably used in the case of forming the matrix wirings of the electron source substrate of the image display apparatus using the electron-emitting devices. According to the matrix wirings, a plurality of lower and upper wirings cross each other through the insulative layer. The forming method of the stacking structure according to the invention is applied to the creation of the stacking structure comprising the lower wirings which are in come into contact with the substrate and the insulative layer arranged thereon.

The electroconductive paste which is used in the invention is a kneading substance which is made of at least the resin component, the electroconductive fine particles, and the glass fine particles and to which a solvent or the like has been added as necessary. The dielectric paste is a kneading substance which is made of at least the resin component and the glass fine particles and to which a solvent or the like has been added as necessary. Metal fine particles of Ag, Au, Pd, Ni, Cu, or the like are generally used as electroconductive fine particles. As glass fine particles, glass fine particles of a PbO system or a BiO system are used for each of the electroconductive paste and the dielectric paste. In each of the electroconductive paste and the dielectric paste, a non-photosensitive resin material such as ethyl cellulose or the like which is generally used and is easily decomposed at a low temperature can be also used as a resin component. However, in the invention, since the problem of the edge curl of the electroconductive layer is prevented, a photosensitive resin of an acrylic system can be preferably used. A screen printing method, a slit coater method, a roll coater method, or the like can be used as a film forming method of the paste and a coating film is formed so as to have a thickness of 1 to 200 μm. According to the screen printing method, the film can be patterned into a predetermined pattern simultaneously with the film forming process. However, it the case where the film is formed by another method different from the above methods, the film is be patterned into the predetermined pattern by photolithography, sand blast, or the like. By applying those methods, the film of the electroconductive paste and the film of the dielectric paste are formed, patterned, and properly dried, thereby forming a precursor stacking structure comprising an electroconductive layer precursor pattern and a dielectric layer precursor pattern. By simultaneously baking the precursor stacking structure, an electroconductive layer and a dielectric layer are obtained.

The invention is characterized by the temperature at which the precursor stacking structure is baked. FIG. 1 shows a temperature profile of a baking step according to the invention.

First, the temperature is raised from 0 to a temperature in a temperature range where it is equal to or higher than a decomposing temperature (T1) of the resin component and is lower than a sintering start temperature (T2) of the glass fine particles in the dielectric paste for a time interval from time 0 to time t1 and the paste films are held in the temperature range for a time interval from t1 to t2 (first step). At this time, in the case of using the resin components whose decomposing temperatures are different with respect to the electroconductive paste and the dielectric paste, the temperature is set to the higher decomposing temperature of the resin component or more. In this temperature range, since the sintering of the glass fine particles in the dielectric layer precursor pattern is not progressed, the gap caused in the dielectric layer precursor pattern by the decomposition of the resin component is not filled but the air necessary to decompose the resin component in the electroconductive layer precursor pattern in the portion covered with the dielectric layer precursor pattern can be supplied through the gap. This gap also plays a role of a passage for promptly ejecting a decomposed product of the resin component to the outside. Although the time interval from 0 to t1 is not particularly limited, it is desirable that such a time interval is as short as possible in order to reduce the time that is required for the manufacturing steps.

Subsequently, the temperature is raised to a temperature in a temperature range where it is equal to or higher than the sintering start temperature (T2) of the glass fine particles in the dielectric paste to a temperature lower than a softening point (T3) of the glass fine particles for a time interval from t2 to t3 (second step). At this stage, the baking of the glass fine particles in the dielectric layer precursor pattern is started. In this point of time, since only the glass fine particles remain in the dielectric layer precursor pattern, the sintering is progressed and the dense film is formed. That is, the whole space in the gap is buried and the insulative layer without a void and a pin hole is obtained. Further, since the temperature in the temperature range is less than the softening point, the desharpening of the shape and, particularly, the further contraction in the inplane direction of the substrate are suppressed. The shape at a point of time when the inside gap is extinguished by the realization of fineness can be almost maintained. The time interval from t3 to t4 is not particularly limited but can be set to an arbitrary time interval so long as the fineness of the film can be obtained. However, it is desirable that such a time interval is as short as possible in order to reduce the time that is required for the manufacturing steps.

After completion of the sintering, the temperature is promptly dropped for time interval from t4 to t5.

In the baking step according to the invention, it is desirable that the sintering start temperature of each of the electroconductive fine particles and the glass fine particles in the electroconductive paste lies within the temperature range in the second step. However, even in the first step, since the decomposing temperature of the resin component contained in the electroconductive paste is generally lower than the sintering start temperature of each of the electroconductive fine particles and the glass fine particles, it is sufficient that the sintering start temperature of each of the electroconductive fine particles and the glass fine particles in the electroconductive paste is less than the sintering start temperature of the glass fine particles in the dielectric paste.

A manufacturing method of the electron source and the image display apparatus to which the forming method of the stacking structure of the invention is applied will now be described.

The electron source according to the invention has a plurality of electron-emitting devices and a plurality of upper and lower wirings which cross each other through the insulative layer and connect the electron-emitting devices in a matrix form on the substrate. The lower wirings and the insulative layer are formed by the forming method of the stacking structure of the invention.

Figure 2A:
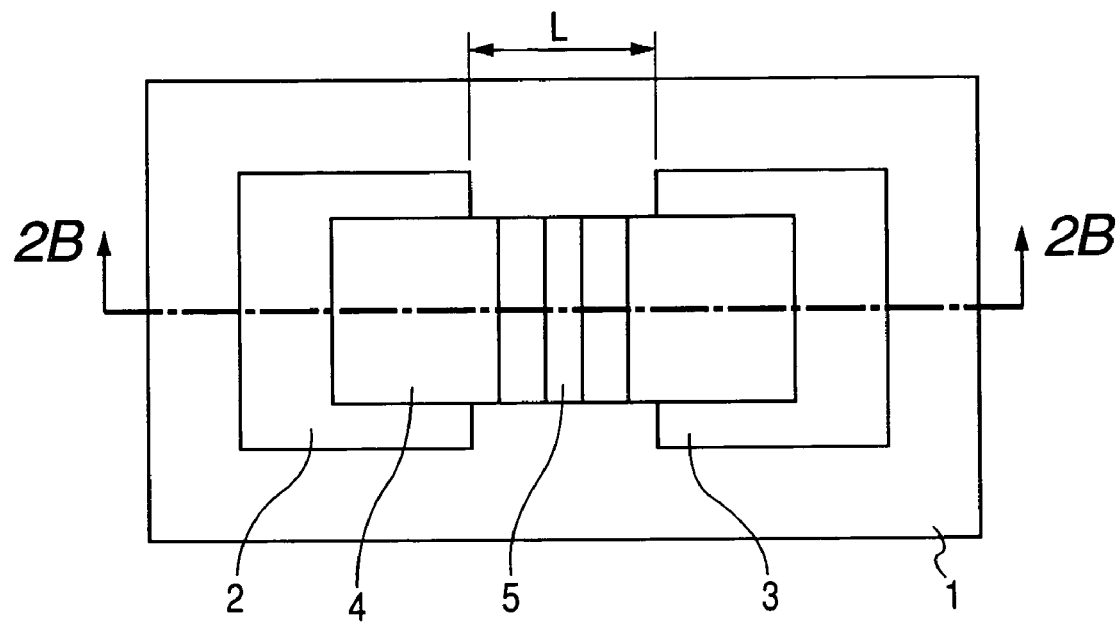
FIGS. 2A and 2B are schematic diagrams showing a construction of an example of an electron-emitting device constructing an electron source according to the invention.
Figure 2B:
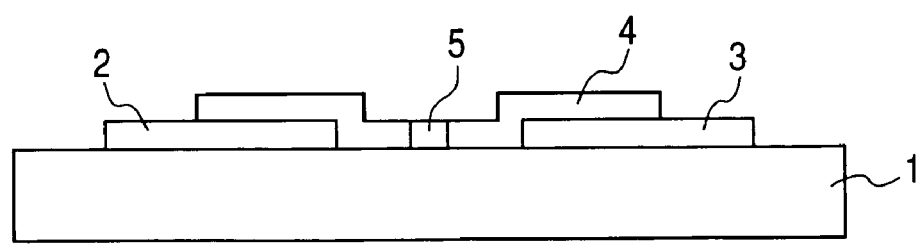

As an example of the electron-emitting devices constructing such an electron source, an example of a construction of the surface conduction electron-emitting device is schematically shown in FIGS. 2A and 2B. FIG. 2B is a cross sectional view taken along the line 2B-2B in FIG. 2A. In the diagrams, reference numeral 1 denotes a substrate; 2 and 3 device electrodes; 4 an electroconductive film; and 5 an electron-emitting region. As other examples, an electron-emitting device of a field-emitting type called an "FE type" and an electron-emitting device having a construction of a metal/insulative layer/metal type called an "MIM type" can be mentioned.

Figure 7:
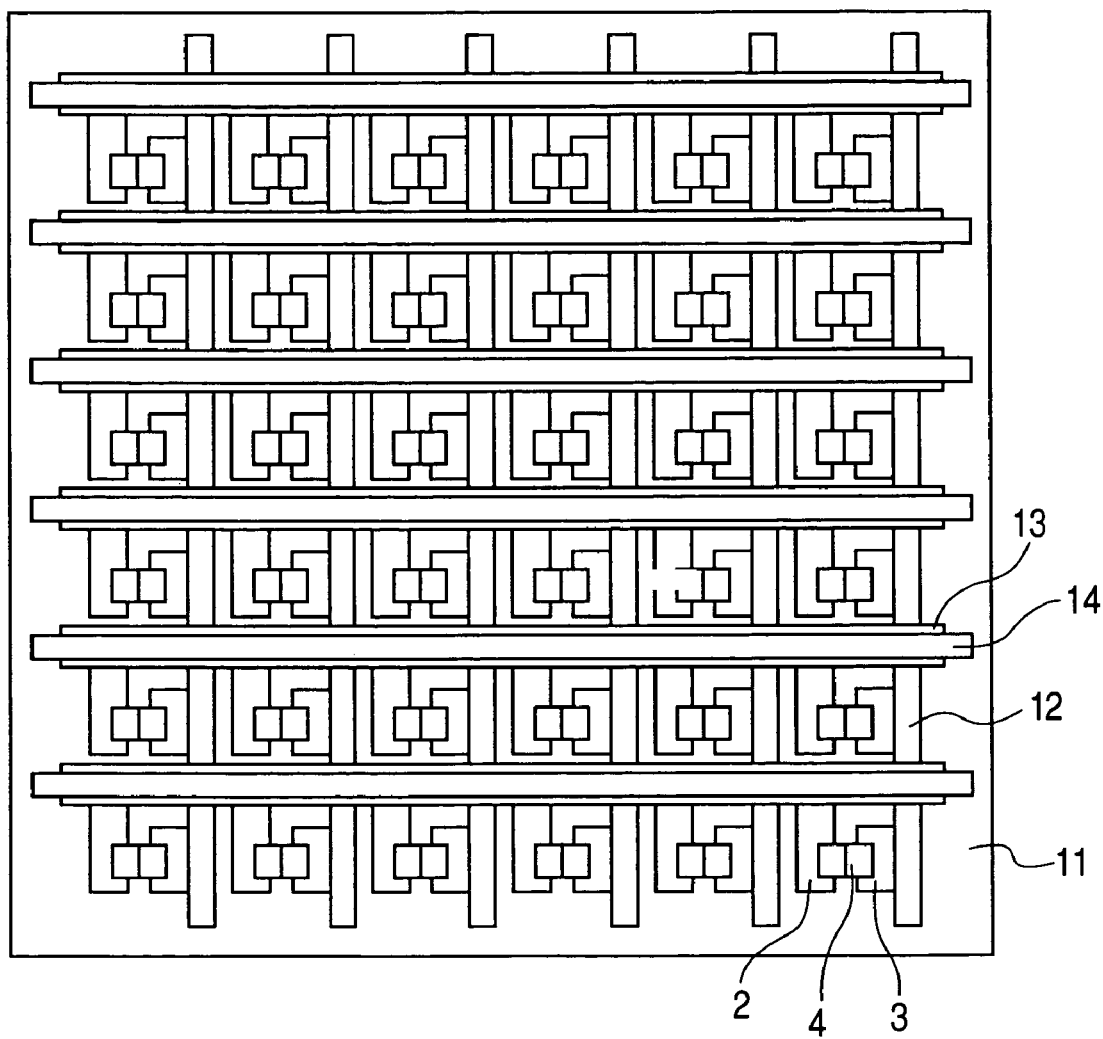
FIG. 7 is a schematic diagram showing a construction of an example of the electron source of the invention.

FIG. 7 schematically shows an example of a construction of an electron source using the electron-emitting devices of FIGS. 2A and 2B. In the diagrams, reference numeral 11 denotes a substrate; 12 lower wirings; 12a an electroconductive layer precursor pattern obtained before the lower wirings 12 are baked; 13 an insulative layer; 13a a dielectric layer precursor pattern before the insulative layer 13 is baked; and 14: upper wirings. The electron source of the embodiment is formed by connecting a plurality of electron-emitting devices onto the substrate 11 in a matrix form and a construction of each of the electron-emitting devices is similar to that shown in FIGS. 2A and 2B. As an electron source in FIG. 7, there can be also mentioned an electron source constructed in such a manner that a plurality of electron-emitting devices each having a pair of device electrodes 2 and 3 are arranged in the X and Y directions in a matrix form, one (2) of the device electrodes of each of the plurality of electron-emitting devices arranged on the same row is connected in common to the upper wiring 14 in the X direction and the other (3) of the device electrode of each of the plurality of electron-emitting devices arranged on the same column is connected in common to the lower wiring 12 in the Y direction. Such an arrangement is what is called a simple matrix layout.

In the manufacturing method of the electron source of the invention, after the lower wirings 12 and the insulative layer 13 are patterned by using the electroconductive paste and the dielectric paste, respectively, they are simultaneously baked. The manufacturing steps of the electron source in FIG. 7 will be described with reference to FIGS. 3 to 7.

Figure 3:
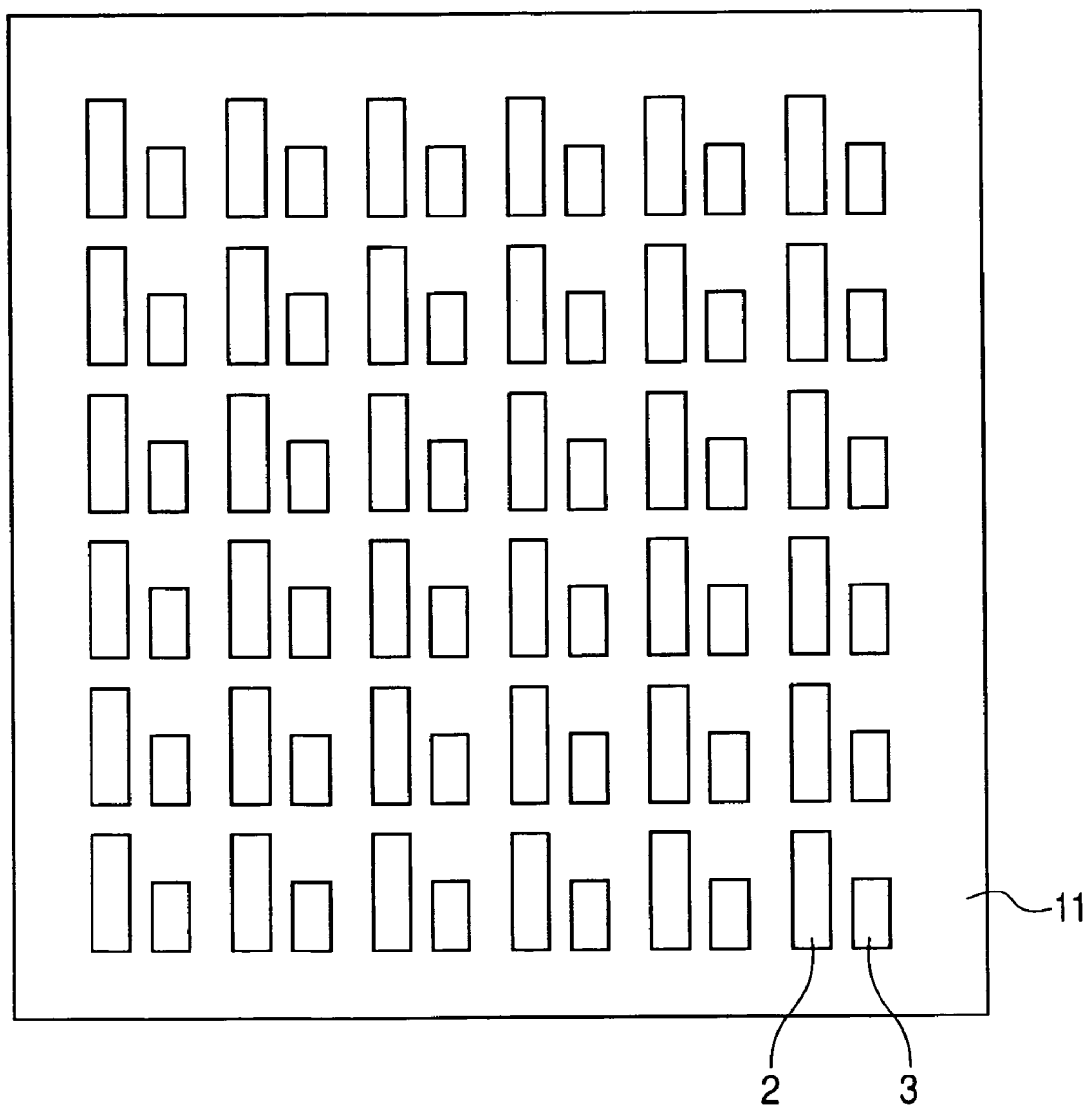
FIG. 3 is a step diagram of an example of a manufacturing method of the electron source of the invention.

After the insulative substrate 11 is sufficiently cleaned by a detergent, pure water, and an organic solvent, the device electrodes 2 and 3 are formed by the general vacuum evaporation depositing technique or photolithography technique (FIG. 3).

As a substrate 11, it is possible to use quartz glass, glass in which a content of impurities such as Na or the like is reduced, soda lime glass, a stacking structure obtained by stacking $SiO_2$ onto the soda lime glass by a sputtering method or the like, ceramics of alumina or the like, an Si substrate, or the like can be used.

A general conductive material can be used as a material of the device electrodes 2 and 3. As such a material, it is possible to properly select, for example, one of a print conductor made of a metal such as Ni, Cr, Au, Mo, W, Pt, Ti, Al, Cu, Pd, or the like or its alloy, a metal such as Pd, Ag, Au, $RuO_2$, Pd—Ag, or the like or its metal oxide, glass, and the like, a transparent conductor such as $In_2O_3$—$SnO_2$ or the like, a semiconductor material such as polysilicon or the like, and the like.

Figure 4:
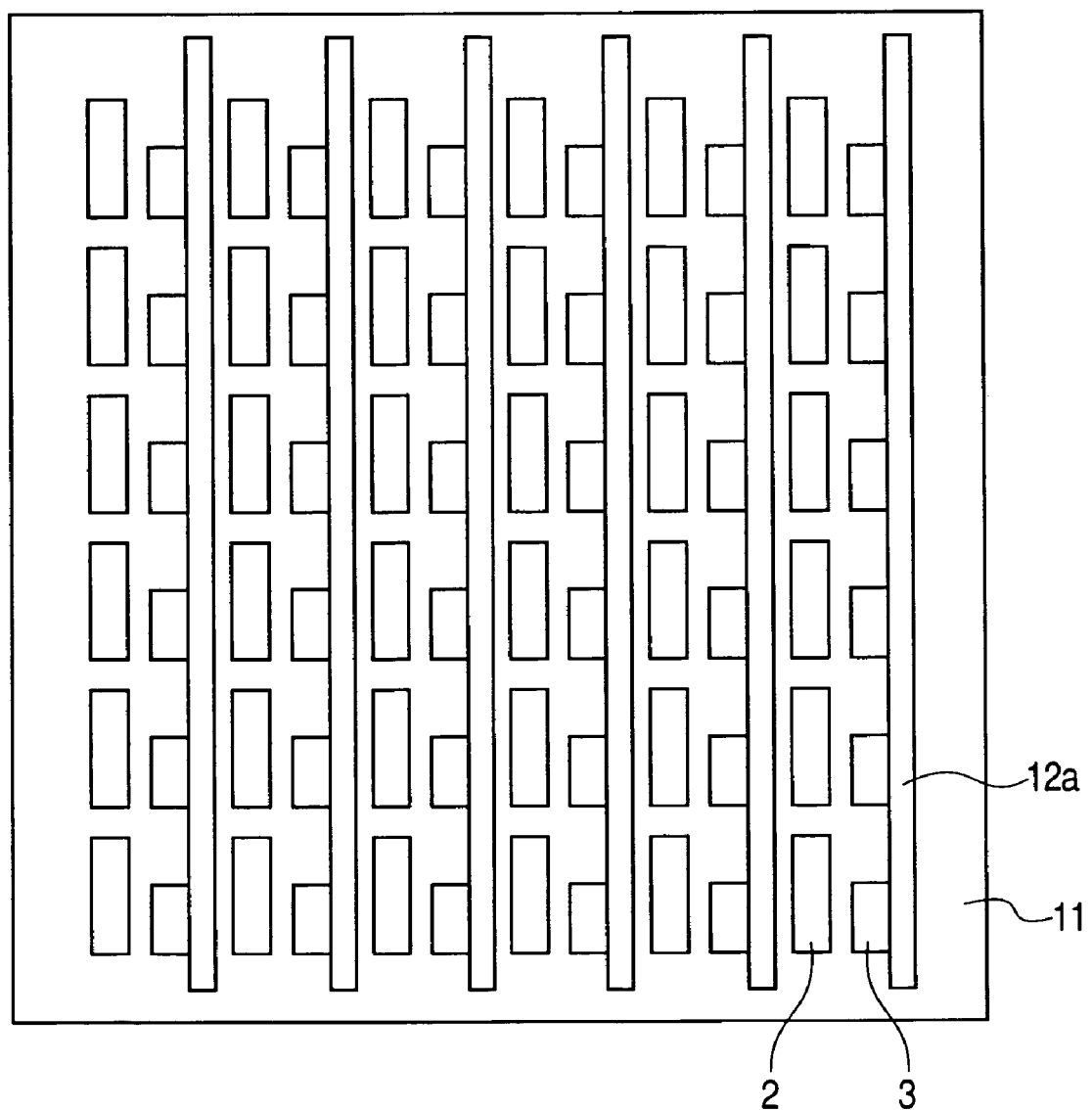
FIG. 4 is a step diagram of an example of the manufacturing method of the electron source of the invention.
Figure 5:
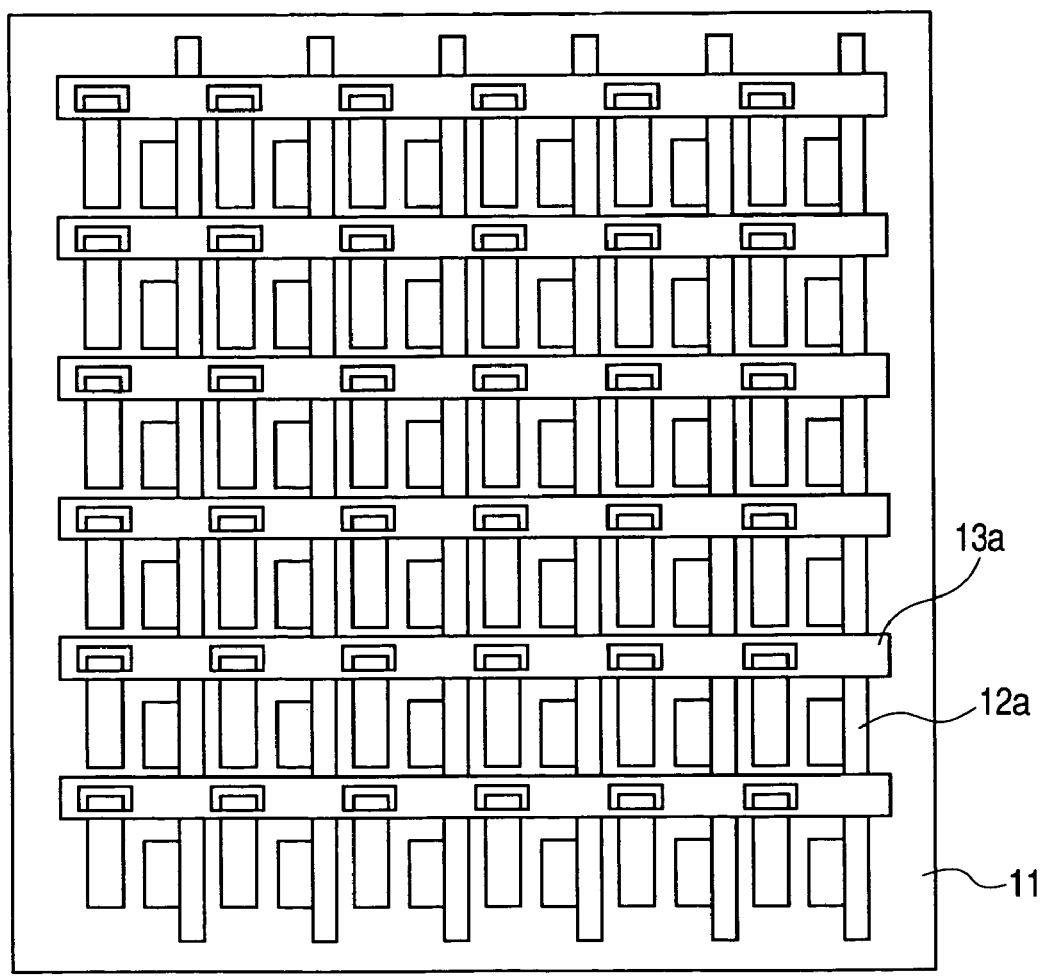
FIG. 5 is a step diagram of an example of the manufacturing method of the electron source of the invention.

Subsequently, by the forming method of the stacking structure of the invention mentioned above, first, the lower wirings 12 are patterned by using the electroconductive paste and the electroconductive layer precursor pattern 12a is formed (FIG. 4). Further, the insulative layer 13 is patterned by using the dielectric paste and the dielectric layer precursor pattern 13a is formed so as to cross the pattern 12a (FIG. 5). At the same time, the lower wirings 12 and the insulative layer 13 are obtained by simultaneously baking those patterns.

Figure 6:
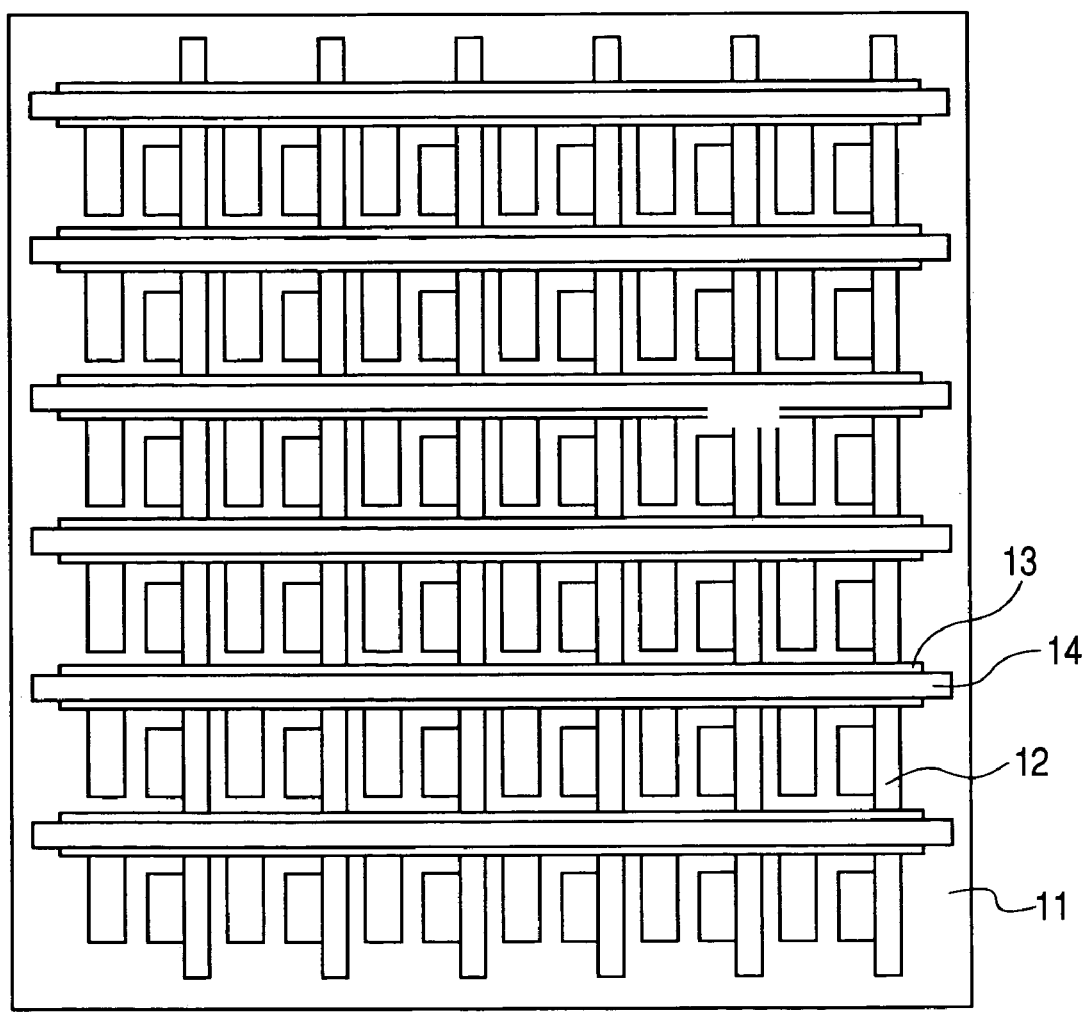
FIG. 6 is a step diagram of an example of the manufacturing method of the electron source of the invention.

The upper wirings 14 are formed on the insulative layer 13 (FIG. 6). Although a forming method of the upper wirings 14 is not particularly limited, for example, a method of using the electroconductive paste in a manner similar to the lower wirings 12, the ordinary vacuum evaporation depositing method, printing method, sputtering method, or the like can be also used.

The electroconductive film 4 connecting the device electrodes 2 and 3 is subsequently formed.

As an electroconductive film 4, a film made of an electroconductive material such as Ni, Au, PdO, Pd, Pt, or the like so as to have a film thickness showing a resistance value Rs (sheet resistance) in a range from $1\times10^2$ to $1\times10^7$ $\Omega/\square$ is preferably used. Rs denotes a value appearing when a resistance R measured in the length direction of the film in which a thickness is equal to t, a width is equal to w, and a length is equal to 1 is assumed to be R=Rs(l/w). When a resistivity is assumed to be ρ, Rs=ρ/t. A film thickness showing the resistance value lies within a range from 5 to 50 nm.

As a specific forming method of the electroconductive film 4, for example, a region between the device electrodes 2 and 3 provided on the substrate 11 is coated with an organic metal solution and dried, thereby forming an organic metal film. The organic metal solution is a solution of an organic metal compound in which a metal such as Pd, Ni, Au, Pt, or the like of the electroconductive film material is used as a main element. After that, the organic metal film is heated, baked, and patterned by the lift-off, etching, or the like, thereby forming the electroconductive film 4. It can be also formed by the vacuum evaporation depositing method, sputtering method, CVD method, distribution coating method, dipping method, spinner method, ink jet method, or the like.

Subsequently, an energizing operation called "forming" is executed between the device electrodes 2 and 3 by applying a pulse-like voltage or a step-up voltage by a power source (not shown) and a gap is formed in a part of the electroconductive film 4. It is preferable that the forming operation is executed under a proper depressurized atmosphere.

An activating process is executed to the device in which the forming has been finished. The activating process is executed by applying a voltage between the device electrodes 2 and 3 under a proper vacuum degree of the atmosphere containing carbon compound gases. By this process, a carbon film made of carbon and/or carbon compound as a main component is deposited onto the electroconductive film 4 from the carbon compound existing in the atmosphere and electron-emitting characteristics are improved.

As a proper carbon compound which is used in the activating step, there can be mentioned: an aliphatic hydrocarbon class of alkane, alkene, or alkyne; an aromatic hydrocarbon class; an alcohol class; an aldehyde class; a ketone class; an amine class; an organic acid class of phenol, carvone, sulfonic acid, or the like; and the like. Specifically speaking, there can be used: saturated hydrocarbon expressed by $C_nH_{2n+2}$ such as methane, ethane, propane, or the like; unsaturated hydrocarbon expressed by a composition formula of $C_nH_{2n}$ or the like such as ethylene, propylene, or the like; benzene; toluene; methanol; ethanol; formaldehyde; acetaldehyde; acetone; methyl ethyl ketone; methylamine; ethylamine; phenol; benzonitrile; tornitrile; formic acid; acetic acid; propionic acid; and the like; or their mixture.

The electron source shown in FIG. 7 is manufactured as mentioned above.

An image display apparatus can be constructed by combining the electron source according to the invention with an image forming member having a light-emitting member which emits light by irradiation of an electron emitted from the electron-emitting device of the electron source. If an image forming member having phosphor which emits visible light by the electron is used as an image forming member, a display panel which is used as a display of a television or a computer can be realized. If a photosensitive drum is used as an image forming member and a latent image which is formed on the photosensitive drum by irradiation of an electron beam can be developed by using toner, a copying apparatus or a printer can be realized.

Figure 8:
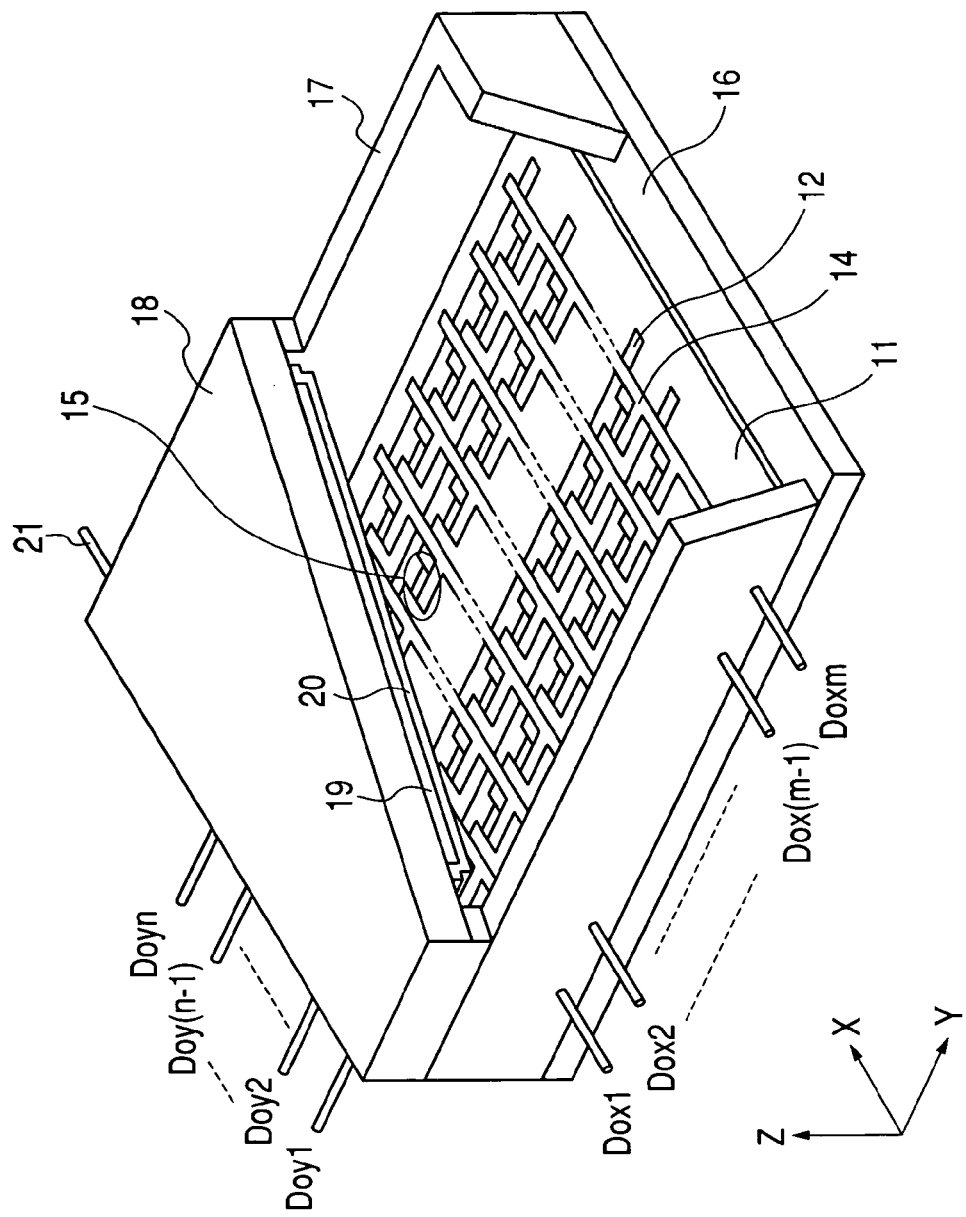
FIG. 8 is a diagram showing a construction of an example of an image display apparatus using the electron source in FIG. 7.
Figure 9A:
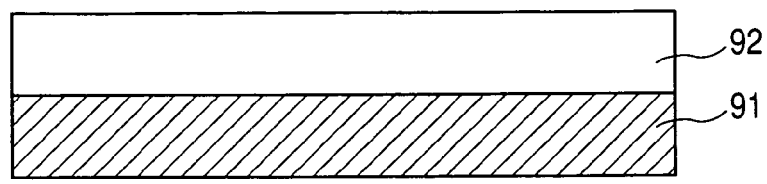
FIGS. 9A, 9B, 9C and 9D are cross sectional schematic diagrams showing conventional forming steps of wirings having a large film thickness using a photosensitive paste.
Figure 9B:
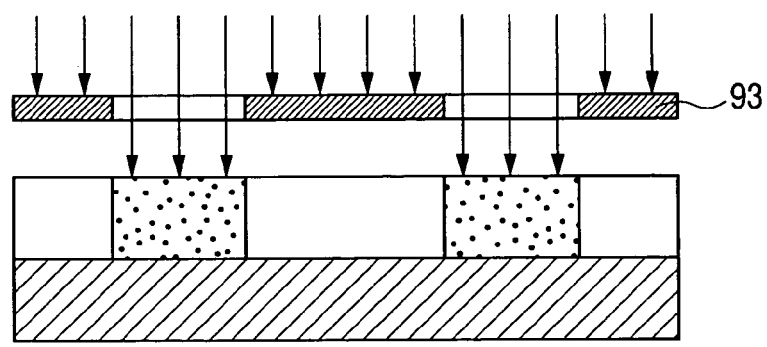
Figure 9C:
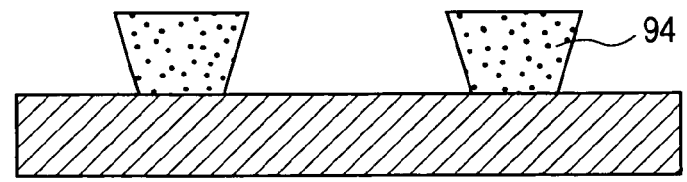
Figure 9D:
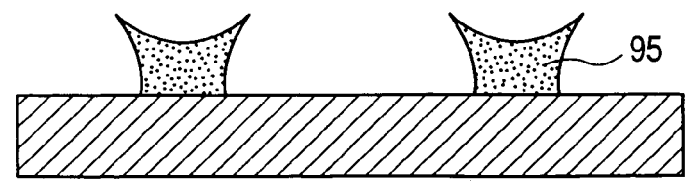

An example of the image display apparatus using the electron source having the simple matrix layout shown in FIG. 7 will now be described with reference to FIG. 8. FIG. 8 is a schematic diagram showing a display panel of the image display apparatus of the invention with a part cut away.

In FIG. 8, reference numeral 15 denotes an electron-emitting device shown in FIG. 1; 16 a rear plate; and 18 a face plate made of a glass substrate. A phosphor film 19, a metal back 20, and the like are formed on the inner surface of the face plate 18. Reference numeral 17 denotes a supporting frame and 21 indicates a high voltage power source. The rear plate 16, the supporting frame 17, and the face plate 18 are seal-bonded in the vacuum atmosphere of, for example, about $10^{-5}$ Pa, thereby forming an envelope. When the electron source substrate 11 has an enough strength, the electron source substrate 11 can be also directly adhered to the supporting frame 17 without using the rear plate 16.

A supporting member (not shown) called a spacer is arranged between the face plate 18 and the electron source substrate 11, so that an envelope having an enough strength against the atmospheric pressure can be also constructed even in the case of a panel having a large display screen.

Further, to maintain a vacuum degree in the envelope obtained after the seal bonding, it is preferable to execute a getter processing before and after the seal bonding.

EMBODIMENTS

Embodiment 1

An electron source is manufactured in accordance with the steps shown in FIGS. 3 to 7.

A Pt/Ti film is formed onto the substrate 11 made of glass by a sputtering film forming method so as to have a thickness of 30 nm/10 nm. A resist is formed in a desired pattern. After that, an unnecessary portion is etched by a milling method. The device electrode 2 having dimensions of (vertical direction×lateral-direction=300 µm×50 µm) and the device electrode 3 having dimensions of (95 µm×100 µm) are formed so as to face each other with an interval (FIG. 3). As those electrodes, (768×3840) pairs of electrodes are formed at a pitch of (vertical direction×lateral direction=600 µm×200 µm).

Subsequently, the substrate 11 on which the electrodes have already been formed is coated with a photosensitive resin paste (electroconductive paste) of Ag by a screen printing method by using a screen plate of SUS#200. The obtained substrate 11 is held at 100° C. for about 15 minutes and dried. A thickness of coating film obtained after the drying is equal to 10 µm. The photosensitive resin paste film of Ag is exposed, developed, and formed so as to have a line width of 50 µm, thereby forming the electroconductive layer precursor pattern 12a (FIG. 4).

Subsequently, the substrate 11 is coated with a photosensitive resin paste (dielectric paste) of PbO system glass by using a screen plate of SUS#145. The obtained substrate 11 is held at 90° C. for about 15 minutes and dried. A film thickness measured from the upper surface of the substrate 11 is equal to about 35 µm. To thicken the film, the substrate 11 is again coated with the photosensitive resin paste (dielectric paste) of the PbO system glass by using the screen plate of SUS#200 and the obtained substrate 11 is dried, so that the dry film of the total thickness of 50 µm is obtained. The photosensitive resin paste of the PbO system is exposed and developed by a stripe pattern which perpendicularly crosses the electroconductive layer precursor pattern 12a so as to have a width of 520 µm, thereby forming the dielectric layer precursor pattern 13a. A through hole of a 100 µm square is formed in the dielectric layer precursor pattern 13a at the center in the width direction. The electrode 2 is exposed to the through hole (FIG. 5).

The substrate 11 formed in this manner is inserted into a sintering furnace, a temperature is elevated to 420° C. at a temperature raising rate of 10° C./min, and the substrate 11 is held at this temperature for 20 minutes. After that, the temperature is elevated to 500° C. at the temperature raising rate of 10° C./min and the substrate 11 is held for 10 minutes. After that, the temperature is decreased to a room temperature in 40 minutes, so that the lower wirings 12 and the insulative layer 13 are obtained.

A softening point of the glass fine particles of the dielectric paste of the PbO system used in the embodiment is equal to 510° C., a sintering start temperature is equal to 480° C., a decomposing temperature of the resin component is equal to 400° C., and a decomposing temperature of the resin component of the electroconductive paste of Ag is equal to 400° C. Further, an Ag stripe pattern having a width of 300 μm is printed onto the formed insulative layer 13 along the stripe pattern by the screen printing, dried, and baked, thereby forming the upper wirings 14 and obtaining the wiring substrate (FIG. 6).

To the wiring substrate manufactured as mentioned above, the electroconductive film 4 having the electron-emitting region is formed between the device electrodes 2 and 3 as mentioned above, thereby manufacturing the electron source shown in FIG. 7.

According to the electron source manufactured in the embodiment, the insulative performance between the lower wirings 12 and the upper wirings 14 is better than that in the case of the conventional electron source in which the lower wirings 12 and the insulative layer 13 have been formed by the different baking steps. Although Ag has been used as a material of the upper and lower wirings, an amount of Ag which is detected near the device electrodes 2 and 3 is also smaller.

Also in the image display apparatus using the electron source manufactured in the embodiment, the high display performance is obtained and the reliability is further improved.

Embodiment 2

In a manner similar to the embodiment 1, after the device electrodes 2 and 3 are formed on the substrate 11, the glass substrate on which the electrodes have already been formed is coated with an Au paste (the ethyl cellulose is used as a resin component) so as to have a line width of 80 μm by the screen printing method by using a screen plate of SUS#400 calendaring. The obtained substrate is held at 100° C. for about 10 minutes and dried, thereby forming the electroconductive layer precursor pattern 12a (FIG. 4). A thickness of the film obtained after the drying is equal to 13 μm.

Subsequently, the substrate 11 is coated with a photosensitive resin paste (dielectric paste) of BiO system glass by using the screen plate of SUS#145. The obtained substrate 11 is held at 90° C. for about 15 minutes and dried. A film thickness measured from the upper surface of the substrate 11 is equal to about 35 μm. To thicken the film, the substrate 11 is again coated with the photosensitive resin paste (dielectric paste) of the BiO system glass by using the screen plate of SUS#200 and the obtained substrate 11 is dried, so that the film of the total thickness of 50 μm is obtained. The photosensitive resin paste (dielectric paste) is exposed and developed by a stripe pattern which perpendicularly crosses the electroconductive layer precursor pattern 12a so as to have a width of 520 μm, thereby forming the dielectric layer precursor pattern 13a (FIG. 5). A through hole of the 100 μm square is formed in the dielectric layer precursor pattern 13a at the center in the width direction. The device electrode 2 is exposed to the through hole.

The substrate formed in this manner is inserted into the sintering furnace, the temperature is elevated to 410° C. at the temperature raising rate of 10° C./min, and the substrate is held at this temperature for 20 minutes. Subsequently, the temperature is elevated to 490° C. at the temperature raising rate of 10° C./min and the substrate is held for 10 minutes. After that, the temperature is decreased to the room temperature in 40 minutes, so that the lower wirings 12 and the insulative layer 13 are obtained.

A softening point of the glass fine particles of the dielectric paste of the BiO system used in the embodiment is equal to 500° C., a sintering start temperature is equal to 470° C., a decomposing temperature of the resin component is equal to 400° C., and a decomposing temperature of the resin component of the Au paste is equal to 360° C. Further, the Ag stripe pattern having a width of 300 μm is printed onto the formed insulative layer 13 along the stripe pattern by the screen printing, dried, and baked, thereby forming the upper wirings 14 and obtaining the wiring substrate (FIG. 6).

To the wiring substrate manufactured as mentioned above, the electroconductive film 4 having the electron-emitting region is formed between the device electrodes 2 and 3 as mentioned above, thereby manufacturing the electron source shown in FIG. 7.

According to the electron source manufactured in the embodiment, the insulative performance between the lower wirings 12 and the upper wirings 14 is better than that in the case of the conventional electron source in which the lower wirings 12 and the insulative layer 13 have been formed by the different baking steps.

Also in the image display apparatus using the electron source manufactured in the embodiment, the high display performance is obtained and the reliability is further improved.

What is claimed is:

1. A forming method of a stacking structure in which an electroconductive layer and a dielectric layer are stacked in, at least, a part, comprising:

a step of forming, onto a substrate, an electroconductive layer precursor pattern comprising at least a resin component, electroconductive fine particles, and glass fine particles;

a step of forming a dielectric layer precursor pattern which covers at least a part of said electroconductive layer precursor pattern, the dielectric layer precursor pattern comprising at least the resin component and the glass fine particles;

a first heating step of heating the electroconductive layer precursor pattern and the dielectric layer precursor pattern at a temperature sufficient such that, and during time period sufficient such that the resin components are decomposed and removed from the electroconductive layer precursor pattern and the dielectric layer precursor pattern and forming voids in the electroconductive layer precursor pattern and the dielectric layer precursor pattern, without sintering the glass fine particles; and a second heating step of heating, at a temperature higher than the temperature of the first heating step, the electroconductive layer precursor pattern and the dielectric layer precursor pattern after being subjected to the first heating step.

2. A method according to claim 1, wherein said resin component is a photosensitive paste.

3. A method according to claim 1, wherein silver fine particles are used as said electroconductive fine particles.

4. A manufacturing method of the electron source, comprising:

provinding a plurality of electron-emitting devices; and providing a plurality of lower wirings and upper wirings which cross each other through an insulative layer and connect said electron-emitting devices in a matrix form on the substrate, wherein said lower wirings and said insulative layer are provided by the forming method of the stacking structure according to claim 1.

5. A manufacturing method of an image display apparatus, comprising:

providing an electron source having a plurality of electron-emitting devices and a plurality of lower wirings and upper wirings which cross each other through an insulative layer and connect said electron-emitting devices in a matrix form on the substrate; and providing an image forming member having light-emitting members each for emitting light by irradiation of an electron emitted from at least one of said electron-emitting devices, wherein said lower wirings and said insulative layer are provided by the forming method of the stacking structure according to claim 1.

* * * * *